(12) United States Patent
Peng et al.

(10) Patent No.: US 10,208,376 B2
(45) Date of Patent: Feb. 19, 2019

(54) APPARATUS AND METHOD FOR COATING OF SMALL ND-FE-B MAGNETS

(71) Applicant: Yantai Shougang Magnetic Materials Inc., Yantai (CN)

(72) Inventors: Zhongjie Peng, Yantai (CN); Kunkun Yang, Yantai (CN); Daoning Jia, Yantai (CN)

(73) Assignee: YANTAI SHOUGANG MAGNETIC MATERIALS INC., Yantai (CN)

( * ) Notice: Subject to any disclaimer, the term of this patent is extended or adjusted under 35 U.S.C. 154(b) by 192 days.

(21) Appl. No.: 14/933,516

(22) Filed: Nov. 5, 2015

(65) Prior Publication Data

US 2016/0122864 A1    May 5, 2016

(30) Foreign Application Priority Data

Nov. 5, 2014 (CN) .......................... 2014 1 0612086

(51) Int. Cl.
*C23C 14/34* (2006.01)
*C23C 14/32* (2006.01)
(Continued)

(52) U.S. Cl.
CPC ............ *C23C 14/32* (2013.01); *C23C 14/021* (2013.01); *C23C 14/16* (2013.01); *C23C 14/223* (2013.01);
(Continued)

(58) Field of Classification Search
CPC ....... C23C 14/223; C23C 14/32; C23C 14/16; C23C 14/50; C23C 14/021; C23C 14/35; H01F 41/02; H01F 41/026
(Continued)

(56) References Cited

U.S. PATENT DOCUMENTS 6,149,785 A    11/2000   Makowiecki et al.
6,391,386 B1   5/2002    Nishiuchi et al.
(Continued)

FOREIGN PATENT DOCUMENTS

CN    1718845        1/2006
CN    101220456 A    7/2008
(Continued)

OTHER PUBLICATIONS

Machine Translation of CN101220456.*
(Continued)

*Primary Examiner* — Rodney G McDonald
(74) *Attorney, Agent, or Firm* — William H. Honaker; Dickinson Wright PLLC

(57) ABSTRACT

The present invention provides an apparatus and a method for coating small Nd—Fe—B magnets. The apparatus includes a furnace having a roller including at least one stirring piece disposed in the compartment. The stirring pieces have an isosceles triangle or trapezoidal shaped cross-section. The side wall of the furnace defines an inlet aperture and an outlet aperture disposed diametrically opposed to one another. A plurality of target source holders include two first target source holders and two second target source holders disposed on the side wall and spaced from one another and between the inlet aperture and the outlet aperture. The method includes a step of disposing a plurality of conductors with the small Nd—Fe—B magnets in the compartment of the roller. The small Nd—Fe—B magnets are mixed with the plurality of conductors in the roller with the roller being rotated of between 5 rpm and 20 rpm.

16 Claims, 3 Drawing Sheets

(51) Int. Cl.
  *C23C 14/16* (2006.01)
  *C23C 14/50* (2006.01)
  *H01F 41/02* (2006.01)
  *C23C 14/22* (2006.01)
  *C23C 14/02* (2006.01)
  *C23C 14/35* (2006.01)

(52) U.S. Cl.
  CPC .............. *C23C 14/35* (2013.01); *C23C 14/50* (2013.01); *H01F 41/02* (2013.01); *H01F 41/026* (2013.01)

(58) Field of Classification Search
  USPC ............... 204/192.12, 192.15, 192.16, 192.2
  See application file for complete search history.

(56) References Cited

U.S. PATENT DOCUMENTS

| | | |
|---|---|---|
| 6,617,044 B2 | 9/2003 | Nishiuchi et al. |
| 6,743,082 B2 | 6/2004 | Tochishita et al. |
| 6,861,089 B2 | 3/2005 | Nishiuchi et al. |
| 6,866,765 B2 | 3/2005 | Ando et al. |
| 6,872,260 B2 | 3/2005 | Nishiuchi et al. |
| 6,878,210 B2 | 4/2005 | Tochishita et al. |
| 6,923,898 B2 | 8/2005 | Yoshimura et al. |
| 6,960,368 B2 | 11/2005 | Nishiuchi et al. |
| 7,056,197 B2 | 6/2006 | Nishiuchi et al. |
| 7,086,934 B2 | 8/2006 | Tochishita et al. |
| 7,270,714 B2 | 9/2007 | Nishiuchi et al. |
| 7,402,226 B2 | 7/2008 | Machida et al. |
| 8,163,106 B2 | 4/2012 | Kikugawa et al. |
| 8,480,815 B2 | 7/2013 | Wang |
| 2001/0023933 A1* | 9/2001 | Ogata ................ C01G 49/0054 252/62.63 |
| 2001/0036508 A1 | 11/2001 | Nishiuchi et al. |
| 2002/0028631 A1 | 3/2002 | Nishiuchi et al. |
| 2003/0108673 A1 | 6/2003 | Nishiuchi et al. |
| 2010/0006182 A1 | 1/2010 | Kikugawa et al. |
| 2010/0295644 A1 | 11/2010 | Kikugawa et al. |
| 2011/0273252 A1 | 11/2011 | Kikugawa et al. |

FOREIGN PATENT DOCUMENTS

| | | | | |
|---|---|---|---|---|
| CN | 101805893 | 8/2010 | | |
| CN | 103160795 | 6/2013 | | |
| CN | 103820765 | 5/2014 | | |
| CN | 103839641 | 6/2014 | | |
| CN | 103854819 | 6/2014 | | |
| CN | 204198844 | 3/2015 | | |
| JP | 0644007 | 6/1994 | | |
| JP | 09108654 | 4/1997 | | |
| JP | 2000133541 | 5/2000 | | |
| JP | 2000269016 A | * | 9/2000 | ........... H01F 1/0572 |
| JP | 2001335921 | 12/2001 | | |
| JP | 2002088467 | 3/2002 | | |
| JP | 2002088468 | 3/2002 | | |
| JP | 2003100537 | 4/2003 | | |
| JP | 2009054716 | 3/2009 | | |
| JP | WO2007114336 | 8/2009 | | |
| JP | WO2008140054 | 8/2010 | | |
| JP | 4540076 | 9/2010 | | |
| JP | 2011077285 | 4/2011 | | |
| JP | 2011157572 | 8/2011 | | |
| JP | 2011216674 | 10/2011 | | |
| JP | 2011216674 A | * | 10/2011 | |
| JP | WO2010013774 | 1/2012 | | |
| KR | 1020040052533 A | 6/2004 | | |
| KR | 100701267 B1 | 3/2007 | | |

OTHER PUBLICATIONS

Machine translation of JP2011-216674A.*
Machine Translation of JP2000-269016 (Year: 2000).*
European Search Report dated Apr. 8, 2016 (One Page).
JP Office Action dated Sep. 9, 2016 (Three Pages).
Jp Office Action dated Mar. 15, 2017 (Three Pages).
JP Search Report dated Jul. 29, 2016 (18 Pages).
SIPO Search Report dated Nov. 5, 2014 (1 Page).
SIPO Supplemental Search Report dated Nov. 5, 2014 (1 Page).

* cited by examiner

APPARATUS AND METHOD FOR COATING OF SMALL ND-FE-B MAGNETS

CROSS REFERENCE TO RELATED APPLICATION

This application claims the benefit of a Chinese Patent Application having a serial number of CN 201410612086.3, published as CN 104480440A and filed on Nov. 5, 2014.

BACKGROUND OF THE INVENTION

1. Field of the Invention

The present invention generally relates to an apparatus and a method for coating small Nd—Fe—B magnets.

2. Description of the Prior Art

Such a method is disclosed in Chinese Patent CN100582290. The method includes a first step of shaping the plurality of Nd—Fe—B magnets including grease into a plurality of small Nd—Fe—B magnets. The next step of the method is cleaning the small Nd—Fe—B magnets. Next, the small Nd—Fe—B magnets are disposed in the compartment of the roller in the chamber of the furnace. Then the chamber of the furnace is sealed. After sealing the chamber of the furnace, air is removed from the chamber to reduce the pressure in the chamber to a first pressure range. The next step of the method is further removing air from the chamber to reduce the first pressure range to a final pressure range. At the final pressure range, an inert gas is fed into the chamber to increase the pressure in the chamber. Then, a film is deposited on the surface of the small Nd—Fe—B magnets.

Such an apparatus is disclosed in the Korean Patent Application KR20040052533. The apparatus includes a furnace including a side wall disposed annularly about a center axis and extending between a first end and a second end. A rear wall is affixed to the second end of the side wall defining a chamber between the side wall and the rear wall. A shaft is rotatably attached to the furnace and extending through the rear wall and into the chamber. A roller of permeable material is disposed in the chamber and attached to the shaft and having an interior surface defining a compartment for receiving the plurality of small Nd—Fe—B magnets. A plurality of target source holders includes at least one first target source holder and at least one second target source holder. The first target source holder is disposed on the side wall of the furnace defining a first exterior surface facing the roller for receiving a first target source and ionizing the first target source to provide a coating for the plurality of small Nd—Fe—B magnets. The second target source holder is disposed on the side wall of the furnace spaced from the first target source and defining a second exterior surface facing the roller for receiving a second target source to provide the coating for the plurality of small Nd—Fe—B magnets.

Due to the potential difference between the Nd-rich phase and the $Nd_2Fe_{14}B$ phase, and an Nd—Fe—B magnet's hydrogen absorption properties, it is very easy for the Nd—Fe—B magnet to corrode. To prevent the Nd—Fe—B magnet from corroding, it is known in the art to provide an anti-corrosive coating layer on the surface of the Nd—Fe—B magnet. The common methods of preparing a film of anti-corrosion coatings on the surface of the Nd—Fe—B magnet include electrophoresis, spraying, vacuum coating, and electroplating.

For small Nd—Fe—B magnets, it is difficult to quickly fixate the small Nd—Fe—B magnets onto a common fixture. Accordingly, methods such as barrel plating or roll spray coating are used to provide an anti-corrosive coating on surface of the small Nd—Fe—B magnets. However, the presence of acid and base during the electroplating process can damage the small Nd—Fe—B magnets. The chemicals used during the spraying process can cause harm to the human body and the environment.

Presently, on some particulate metal and non-metal composite parts, there are examples using a roller disposed inside an oblique horizontal magnetron multi-arc ion coating machine to carry out the anti-corrosion coating process. However, the structure of the furnace is complex and has specific shape requirements for the coating samples. In addition, such an apparatus has not been in use in the field of vacuum coating Nd—Fe—B magnets.

SUMMARY OF THE INVENTION

The invention provides for such method wherein the step of disposing the small Nd—Fe—B magnets in the compartment further includes a step of disposing the plurality of conductors defining the particle size between 2 mm and 6 mm and having the predetermined weight of between 0.25 to 1.5 times the weight of the Nd—Fe—B magnets with the small Nd—Fe—B magnets in the compartment of the roller in the chamber of the furnace.

The invention provides for such apparatus including at least one stirring piece disposed in the compartment of the roller and attached to the interior surface of the roller and extending radially inwardly from the interior surface of the roller for mixing the plurality of small Nd—Fe—B magnets.

Advantages of the Invention

The present invention provides a method for coating the small Nd—Fe—B magnets that minimizes damages of the Nd—Fe—B matrix of the small Nd—Fe—B magnets. The present invention also provides an environmentally friendly method of coating small Nd—Fe—B magnets.

The present invention provides an apparatus for coating the small Nd—Fe—B magnets having a simple structure and requiring less shape specificity of the small Nd—Fe—B magnets. The present invention also provides an apparatus that has a high efficiency in coating the Nd—Fe—B magnets.

BRIEF DESCRIPTION OF THE DRAWINGS

Other advantages of the present invention will be readily appreciated, as the same becomes better understood by reference to the following detailed description when considered in connection with the accompanying drawings wherein.

DESCRIPTION OF THE ENABLING EMBODIMENT

Figure 1:
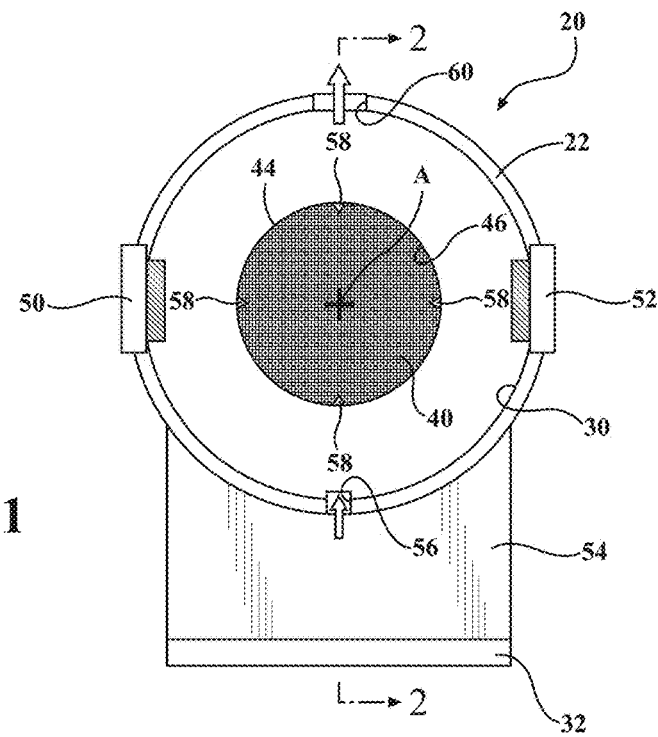
FIG. 1 is a front view of the apparatus for coating the small Nd—Fe—B magnets including the stirring pieces having an isosceles triangle shaped cross-section.

Referring to the Figures, wherein like numerals indicate corresponding parts throughout the several views, an apparatus for coating a plurality of small Nd—Fe—B magnets in accordance with the present invention is generally shown in FIG. 1.

The apparatus includes a furnace 20 having a cylindrical shape. The furnace 20 includes a side wall 22 disposed annularly about a center axis A and extends along the center axis A between a first end 24 and a second end 26. The furnace 20 includes a rear wall 28 having a circular shape disposed adjacent to the second end 26 of the side wall 22. The rear wall 28 is affixed to the second end 26 of the side wall 22 to define a chamber 30 having a cylindrical shape extending between the side wall 22 and the rear wall 28.

A door 32 having a circular shape is disposed adjacent to the first end 24 of the side wall 22 opposite of the rear wall 28 and is removably affixed to the first end 24 of the side wall 22 for closing and sealing the chamber 30. The door 32 defines an observation window 34 disposed on the center axis A for allowing a user to look into chamber 30. In other words, the door 32 allows the user to have access to the chamber 30 of the furnace 20.

A shaft 36 having a cylindrical shape is rotatably disposed on the center axis A. The shaft 36 is also rotatably attached to the rear wall 28 and extends along the center axis A through the rear wall 28 into the chamber 30 to a distal end 38. A roller 40 having a cylindrical shape is disposed in the chamber 30 and attached to the distal end 38 of the shaft 36 to rotate with the shaft 36. The shaft 36 can be rotated mechanically or by a motor. The roller 40 is made from a permeable material such as a mesh of stainless steel wires. The roller 40 extends annularly about the center axis A and outwardly from the shaft 36 to a tip 42 spaced from the door 32. The roller 40 has an interior surface 44 defining a compartment 46 extending between the distal end 38 of the shaft 36 and the roller 40. The compartment 46 is in fluid communication with the chamber 30 through the roller 40.

A plate 48 having a circular shape and is made from a mesh of stainless steel wires is disposed adjacent to the tip 42 of the roller 40 and removably affixed to the tip 42 of the roller 40 for closing the compartment 46. A plurality of target source holders 50, 52 includes at least one first target source holder 50 disposed on the side wall 22 of the furnace 20 defining a first exterior surface facing the roller 40 for receiving a first target source and ionizing the first target source to provide a coating for the plurality of small Nd—Fe—B magnets. The plurality of target source holders 50, 52 further include at least one second target source holder 52 disposed on the side wall 22 of the furnace 20 spaced from the first target source and defining a second exterior surface facing the roller 40 for receiving a second target source to provide the coating for the plurality of small Nd—Fe—B magnets. A frame 54 is disposed adjacent to the inlet aperture 56 of the side wall 22 to receive and support the furnace 20.

Figure 3:
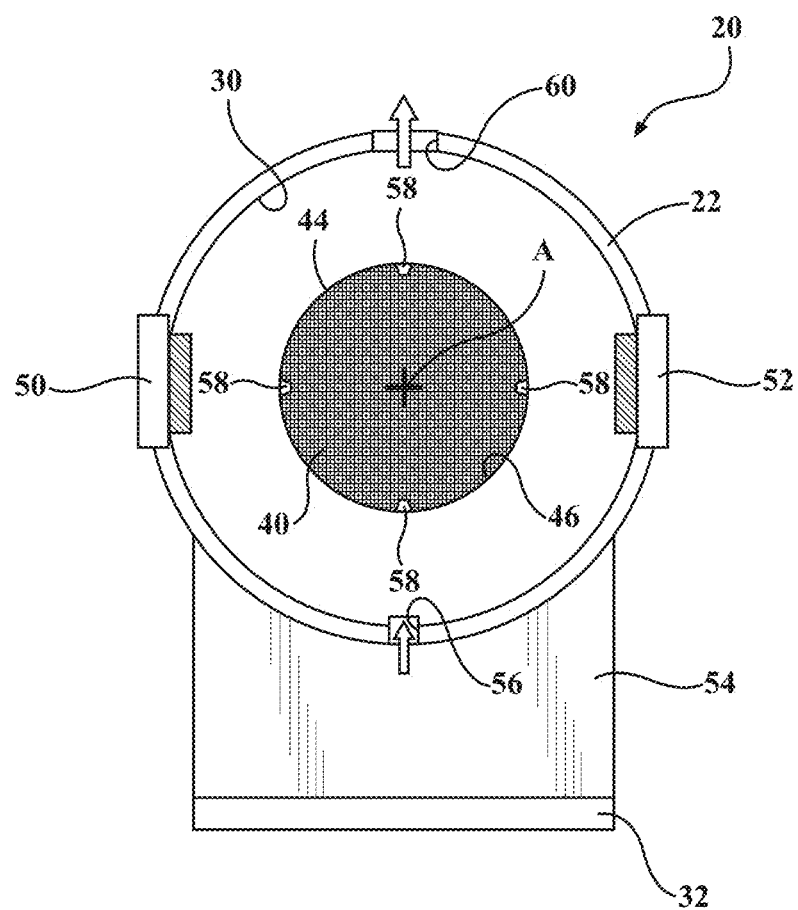
FIG. 3 is a front view of the apparatus for coating the small Nd—Fe—B magnets including the stirring pieces having an trapezoidal shaped cross-section.

The roller 40 includes at least one stirring piece 58 disposed in the compartment 46 of the roller 40. The stirring piece 58 is attached to the interior surface 44 of the roller 40 and extends radially inwardly from the interior surface 44 of the roller 40 for mixing the plurality of small Nd—Fe—B magnets. The at least one stirring piece 58 further includes a plurality of four stirring pieces 58 disposed on the interior surface 44 of the roller 40 in the compartment 46 and spaced from one another with each of the stirring pieces 58 being disposed adjacent and 90° relative from one another and extending outwardly from the roller 40 toward the center axis A. Each of the stirring pieces 58 has an isosceles triangular shape in cross-section as shown in FIG. 1. Alternatively, instead of isosceles triangular shape in cross-section, each of the stirring pieces 58 has a trapezoidal shape in cross-section as shown in FIG. 3.

The side wall 22 of the furnace 20 defines an outlet aperture 60 and an inlet aperture 56. The outlet aperture 60 has a circular shape and is disposed in fluid communication with the chamber 30 for withdrawing air from the chamber 30 to reduce pressure in the chamber 30. The inlet aperture 56 has a circular shape, spaced from the outlet aperture 60, and is disposed diametrically opposed to the outlet aperture 60 of the side wall 22 and in fluid communication with the chamber 30 for feeding an inert gas of argon to the chamber 30 to form an inert environment in the chamber 30.

The plurality of target source holders 50, 52 include two first target source holders 50 disposed on the side wall 22 and spaced from one another and between the inlet aperture 56 and the outlet aperture 60 and at a first angle of 90° relative to the inlet aperture 56 and the outlet aperture 60. The plurality of target source holders 50, 52 including two second target source holders 52 disposed on the side wall 22 and spaced from one another and between the inlet aperture 56 and the outlet aperture 60 and diametrically opposed to the first target source holders 50 at a second angle of 90° relative to the inlet aperture 56 and the outlet aperture 60.

It is another aspect of the present invention to provide a method for coating a plurality of Nd—Fe—B magnets including grease. The method uses a furnace 20 having a side wall 22 defining a chamber 30 disposed on a center axis A. The side wall 22 defines an outlet aperture 60 and an inlet aperture 56. A rear wall 28 is affixed to the side wall 22. A shaft 36 rotatable about the center axis A extends through the rear wall 28 and into the chamber 30. A roller 40 defining a compartment 46 is rotatably attached to the shaft 36. At least one target source holder disposed on the side wall 22. A target source of aluminum is disposed on the target source holder. A plurality of conductors of metal and having a spherical shape defining a particle size between 2 mm and 6 mm and having a predetermined weight of between 0.25 and 1.5 times the weight of the Nd—Fe—B magnets.

The method includes a first step of shaping the plurality of Nd—Fe—B magnets into a plurality of small Nd—Fe—B magnets. The step of shaping is further defined as shaping the plurality of Nd—Fe—B magnets into a plurality of small Nd—Fe—B magnets defining a length and a width and a thickness with each of the length and the width and the thickness being no more than 15 mm and the difference between the length and the width and the thickness being no more than 10 mm. The next step of the method is clean the small Nd—Fe—B magnets. The step of cleaning the Nd—Fe—B magnets further includes a step of removing the grease from the small Nd—Fe—B magnets and a step of washing the small Nd—Fe—B magnets using an acid.

The method also includes a step of disposing the small Nd—Fe—B magnets in the compartment 46 of the roller 40 in the chamber 30. Next, the chamber 30 of the furnace 20 is sealed. After sealing the chamber 30, air is removed from the chamber 30, through the outlet aperture 60 of the side wall 22, to reduce pressure in the chamber 30 to a first pressure range of between $6.0 \times 10^{-3}$ Pa and $9.0 \times 10^{-3}$ Pa. Then, the air is further removed from the chamber 30 through the outlet aperture 60 of the side wall 22 to further reduce the first pressure range in the chamber 30 to a final pressure range of between $3.0 \times 10^{-3}$ Pa and $6.0 \times 10^{-3}$ Pa. At the final pressure range, an inert gas of Argon is fed into the chamber 30 through the inlet aperture 56 of the side wall 22 into the chamber 30 to increase the pressure in the chamber to between $3.0 \times 10^{-1}$ Pa and $6.0 \times 10^{-1}$ Pa.

The next step of the method is depositing a film on the surface of the small Nd—Fe—B magnets. The step of depositing the film further includes a step of applying an electrical potential of 20V to the target source of aluminum to produce a plurality of ions of aluminum. Then, the ions of aluminum are directed to the surface of the small Nd—Fe—B magnets to produce the film. The step of depositing the film can be performed using an arc ion plating process or a magnetron sputtering process.

The step of disposing the small Nd—Fe—B magnets in the compartment 46 further includes a step of disposing the plurality of conductors with the small Nd—Fe—B magnets in the compartment 46 of the roller 40 in the chamber 30 of the furnace 20. The plurality of conductors has the particle size of between 2 mm and 6 mm. The plurality of conductors also has the predetermined weight of between 0.25 to 1.5 times the weight of the Nd—Fe—B magnets. Next, the small Nd—Fe—B magnets are mixed with the plurality of conductors in the roller 40 at the first pressure range. The step of mixing the small Nd—Fe—B magnets and the plurality of conductors is further defined as rotating the roller 40 containing the small Nd—Fe—B magnets and the plurality of conductors at a rate of between 5 rpm and 20 rpm.

The method of the present invention can be used in the preparation of various metal film layers including aluminum film, copper film, titanium film, terbium film layer, dysprosium layer, neodymium film, or an alloy film.

In order to have a better understanding of the present invention, the implementing examples set forth below provide illustrations of the present invention. The implementing examples are only used to illustrate the present invention and do not limit the scope of the present invention.

Implementing Example 1

Figure 2:
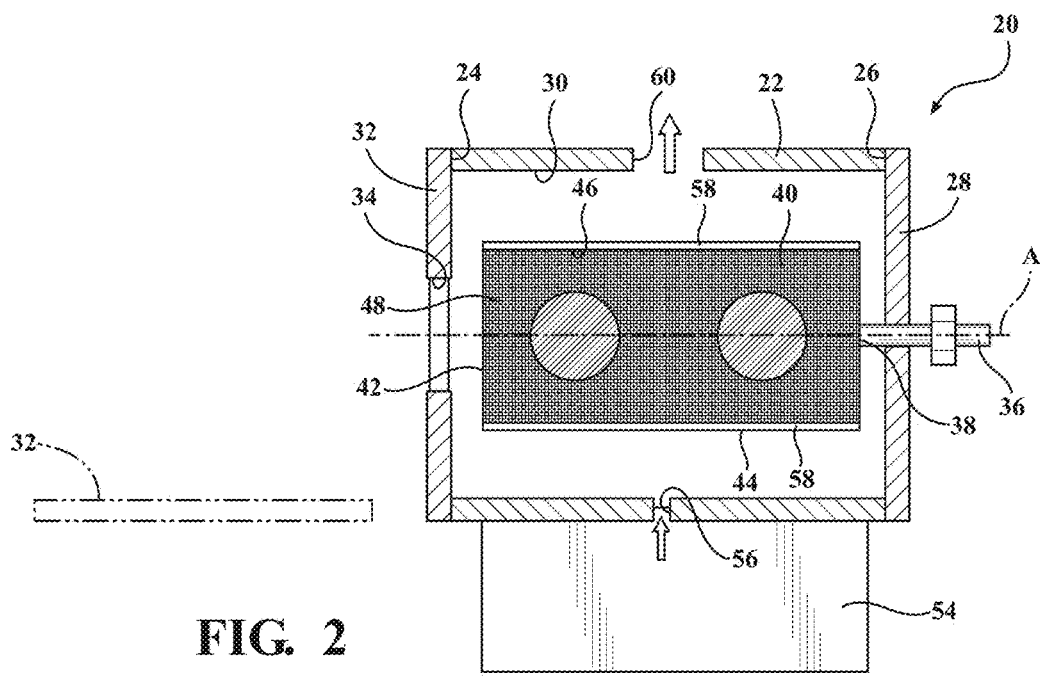
FIG. 2 is a cross-sectional perspective view of the apparatus for coating the small Nd—Fe—B magnets along the lines 2-2 of FIG. 1.

For Implementing Example 1, the apparatus mentioned above and as generally shown in FIGS. 1 and 2 is used.

A plurality of the small Nd—Fe—B magnet having a weight of 2 kg with a dimension size of 7 mm×1.46 mm×0.85 mm and a plurality of conductors of steel and each having a spherical shape, defining a particle diameter of 2 mm and having a total mass of 3 kg, are disposed in the compartment of the roller. Air is removed from the chamber of the furnace reducing pressure in the chamber to the first pressure range of between $8.5 \times 10^{-3}$ Pa and $9.0 \times 10^{-3}$ Pa. After reducing the pressure in the chamber to the first pressure range, roller is constantly rotated at a rate of 20 rpm to mix the small Nd—Fe—B magnets and the plurality of conductors. The stirring pieces in the roller are constantly mixing the small Nd—Fe—B magnets and the plurality of conductors. The air is further removed from the chamber of the furnace to reduce the first pressure range to the final pressure range of between $3.0 \times 10^{-3}$ Pa and $3.5 \times 10^{-3}$ Pa. The inert gas of Argon is then introduced into the chamber of the furnace increasing the final pressure range to between $5.5 \times 10^{-1}$ Pa and $6.0 \times 10^{-1}$ Pa. After the final pressure range has reached between $5.5 \times 10^{-1}$ Pa and $6.0 \times 10^{-1}$ Pa, an electric potential of 20V, having a current of 60 A, is applied to the target source holders containing the target source of aluminum to begin depositing a film of aluminum on the surface of the small Nd—Fe—B magnets. After 30 minutes of depositing the film of aluminum, the small Nd—Fe—B magnets are cooled.

Figure 4:
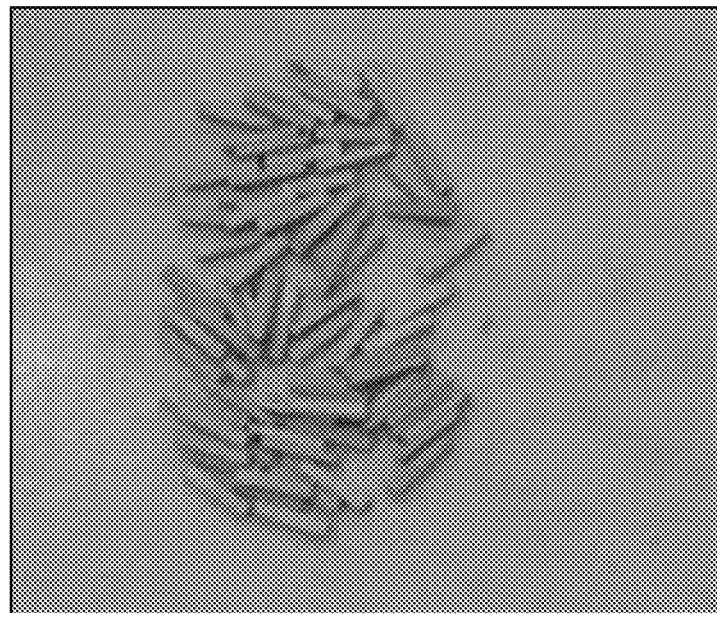
FIG. 4 is an illustration of the Nd—Fe—B magnets having the first film as set forth in Implementing Example 1.
Figure 5:
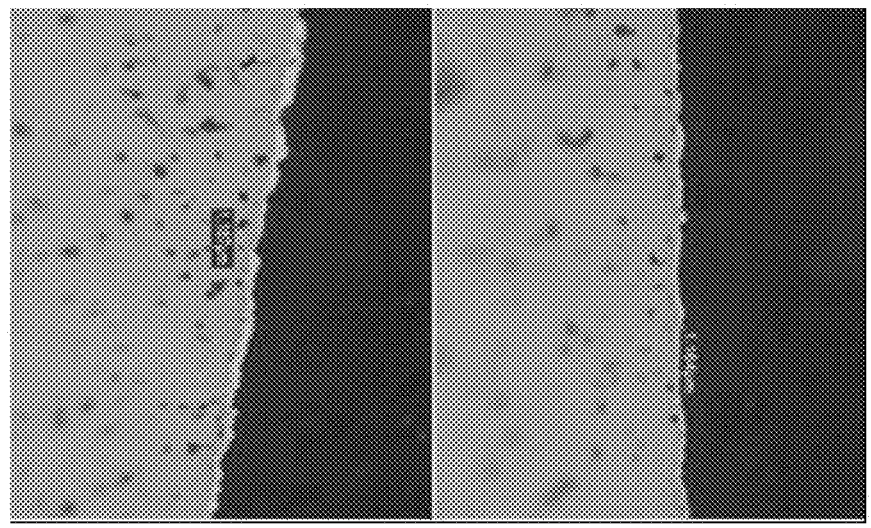
FIG. 5 is an illustration of the thickness of the cross-section of Nd—Fe—B magnets under an optical microscope.

The small Nd—Fe—B magnets including the film of aluminum obtained from Implementing Example 1 is analyzed. As shown in FIG. 4, the surface of the aluminum film is bright and clean. The cross-section of the Nd—Fe—B magnets are examined under the observation of an optical microscope, as shown in FIG. 5, the film of aluminum on the small Nd—Fe—B magnets has a uniform thickness.

Implementing Example 2

For Implementing Example 2, the apparatus mentioned above and as generally shown in FIGS. 1 and 2 is used.

A plurality of the small Nd—Fe—B magnet having a weight of 2 kg with a dimension size of 8 mm×6 mm×8 mm and the plurality of conductors of steel and each having a spherical shape, defining the particle diameter of 6 mm and having a total mass of 0.5 kg, are disposed in the compartment of the roller. Air is removed from the chamber of the furnace reducing pressure in the chamber to the first pressure range of between $6.0 \times 10^{-3}$ Pa and $6.5 \times 10^{-3}$ Pa. After reducing the pressure in the chamber to the first pressure range, roller is constantly rotated at a rate of 5 rpm to mix the small Nd—Fe—B magnets and the plurality of conductors. The stirring pieces in the roller are constantly mixing the small Nd—Fe—B magnets and the plurality of conductors. The air is further removed from the chamber of the furnace to reduce the first pressure range to the final pressure range of between $5.5 \times 10^3$ Pa and $6.0 \times 10^{-3}$ Pa. The inert gas of Argon is then introduced into the chamber of the furnace increasing the final pressure range to between $3.0 \times 10^{-1}$ Pa and $3.5 \times 10^{-1}$ Pa. After the final pressure range has reached between $3.0 \times 10^{+1}$ Pa and $3.5 \times 10^{-1}$ Pa, an electric potential of 20V, having a current of 60 A, is applied to the target source holders containing the target source of aluminum to begin depositing a film of aluminum on the surface of the small Nd—Fe—B magnets. After 60 minutes of depositing the film, the small Nd—Fe—B magnets are cooled.

Obviously, many modifications and variations of the present invention are possible in light of the above teachings and may be practiced otherwise than as specifically described while within the scope of the appended claims. The use of the word "said" in the apparatus claims refers to an antecedent that is a positive recitation meant to be included in the coverage of the claims whereas the word "the" precedes a word not meant to be included in the coverage of the claims. In addition, the reference numerals in the claims are merely for convenience and are not to be read in any way as limiting.

What is claimed is:

1. A method of coating a plurality of Nd—Fe—B magnets including grease using a furnace having a side wall defining a chamber disposed on a center axis and an outlet aperture and an inlet aperture and, a rear wall affixed to the side wall, a shaft rotatable about the center axis extending through the rear wall and into the chamber, a roller defining a compartment and rotatably attached to the shaft, at least one target source holder disposed on the side wall, a target source of aluminum on the target source holder, and a plurality of conductors of metal and having a spherical shape, said method comprising the steps of;

shaping the plurality of Nd—Fe—B magnets including grease into a plurality of small Nd—Fe—B magnets defining a length and a width and a thickness with each of the length and the width and the thickness being no more than 15 mm and the difference between the length and the width and the thickness being no more than 10 mm, cleaning the small Nd—Fe—B magnets to remove the grease, disposing the small Nd—Fe—B magnets in the compartment of the roller in the chamber of the furnace, sealing the chamber of the furnace, removing air from the chamber to reduce the pressure in the chamber to a first pressure range, further removing air from the chamber to reduce the first pressure range to a final pressure range, feeding an inert gas into the chamber at the final pressure range to increase the pressure in the chamber, depositing a film on the small Nd—Fe—B magnets, and said step of disposing the small Nd—Fe—B magnets in the compartment further including a step of disposing the plurality of conductors defining a particle size between 2 mm and 6 mm and having the predetermined weight of between 0.25 to 1.5 times the weight of the small Nd—Fe—B magnets with the small Nd—Fe—B magnets in the compartment of the roller in the chamber of the furnace.

2. The method as set forth in claim 1 further includes a step of disposing the small Nd—Fe—B magnets in the compartment further includes a step of mixing the small Nd—Fe—B magnets with the plurality of conductors in the roller at the first pressure range.

3. The method as set forth in claim 2 wherein said step of mixing the small Nd—Fe—B magnets with the plurality of conductors in the roller is further defined as rotating the roller at a predetermined rate of between 5 rpm and 20 rpm.

4. The method as set forth in claim 1 wherein said step of shaping is further define as shaping the plurality of Nd—Fe—B magnets including grease into a plurality of small Nd—Fe—B magnets each defining a length and a width and a thickness with each of the length and the width and the thickness being no more than 15 mm and the difference between the length and the width and the thickness being no more than 10 mm.

5. The method as set forth in claim 1 wherein said step of cleaning the small Nd—Fe—B magnets further includes a step of removing the grease from the small Nd—Fe—B magnets.

6. The method as set forth in claim 5 wherein said step of cleaning the small Nd—Fe—B magnets further includes a step of washing the small Nd—Fe—B magnets with an acid.

7. The method as set forth in claim 1 wherein said step of removing air from the chamber is further defined as removing air from the chamber through the outlet aperture of the side wall to the first pressure range between $6.0 \times 10^{-3}$ Pa and $9.0 \times 10^{-3}$ Pa.

8. The method as set forth in claim 1 wherein said step of further removing air from the chamber is further defined as further removing air from the chamber through the outlet aperture of the side wall to reduce the first pressure range to the final pressure range of between $3.0 \times 10^{-3}$ Pa and $6.0 \times 10^{-3}$ Pa.

9. The method as set forth in claim 1 wherein said step of feeding the inert gas is further defined as feeding the inert gas of Argon through the inlet aperture of the side wall into the chamber at the final pressure range to increase the pressure in the chamber to between $3.0 \times 10^{-1}$ Pa and $6.0 \times 10^{-1}$ Pa.

10. The method as set forth in claim 1 wherein said step of depositing the film further includes a step of applying an electrical potential of 20V to the target source of aluminum to produce a plurality of ions of aluminum.

11. The method as set forth in claim 10 wherein said step of depositing the film further includes a step of directing the ions of aluminum to the surface of the small Nd—Fe—B magnets to produce the film.

12. The method as set forth in claim 1 wherein said step of depositing the film is further defined as arc ion plating.

13. The method as set forth in claim 1 wherein said step of depositing the film is further defined as magnetron sputtering.

14. A method of coating a plurality of Nd—Fe—B magnets including grease using a furnace having a side wall defining a chamber disposed on a center axis and an outlet aperture and an inlet aperture and, a rear wall affixed to the side wall, a shaft rotatable about the center axis extending through the rear wall and into the chamber, a roller defining a compartment and rotatably attached to the shaft, at least one target source holder disposed on the side wall, a target source of aluminum on the target source holder, and a plurality of conductors of metal and having a spherical shape, said method comprising the steps of;

shaping the plurality of Nd—Fe—B magnets into a plurality of small Nd—Fe—B magnets, said step of shaping being further defined as shaping the plurality of Nd—Fe—B magnets into a plurality of small Nd—Fe—B magnets defining a length and a width and a thickness with each of the length and the width and the thickness being no more than 15 mm and the difference between the length and the width and the thickness being no more than 10 mm, cleaning the small Nd—Fe—B magnets to remove the grease, said step of cleaning further including a step of washing the small Nd—Fe—B magnets using an acid, disposing the small Nd—Fe—B magnets in the compartment of the roller in the chamber, sealing the chamber of the furnace, removing air from the chamber through the outlet aperture of the side wall to reduce pressure in the chamber to a first pressure range of between $6.0 \times 10^{-3}$ Pa and $9.0 \times 10^{-3}$ Pa, further removing air from the chamber through the outlet aperture of the side wall to further reduce the first pressure range in the chamber to a final pressure range of between $3.0 \times 10^{-3}$ Pa and $6.0 \times 10^{-3}$ Pa, feeding an inert gas of Argon into the chamber at the final pressure range to increase the pressure in the chamber to between $3.0 \times 10^{-1}$ Pa and $6.0 \times 10^{-1}$ Pa, said step of feeding the inert gas being further defined as feeding the inert gas of Argon through the inlet aperture of the side wall into the chamber at the final pressure range, depositing a film on the small Nd—Fe—B magnets, said step of depositing the film further including a step of applying an electrical potential of 20V to the target source of aluminum to produce a plurality of ions of aluminum, said step depositing the film further includes a step of directing the ions of aluminum to the small Nd—Fe—B magnets to produce the film, said step of disposing the small and the plurality of conductors in the compartment further including a step of disposing the plurality of conductors defining a particle size between 2 mm and 6 mm and having the predetermined weight of between 0.25 to 1.5 times the weight of the small Nd—Fe—B magnets with the small Nd—Fe—B magnets in the compartment of the roller in the chamber of the furnace, mixing the small Nd—Fe—B magnets and the plurality of conductors in the roller at the first pressure range, said step of mixing being further defined as rotating the roller containing the small Nd—Fe—B magnets and the plurality of conductors at a rate of between 5 rpm and 20 rpm.

15. The method as set forth in claim 14 wherein said step of depositing the film is further defined as arc ion plating.

16. The method as set forth in claim 14 wherein said step of depositing the film is further defined as magnetron sputtering.

* * * * *